United States Patent
Jawarani et al.

(10) Patent No.: US 7,235,473 B2
(45) Date of Patent: Jun. 26, 2007

(54) DUAL SILICIDE SEMICONDUCTOR FABRICATION PROCESS

(75) Inventors: Dharmesh Jawarani, Round Rock, TX (US); Chong-Cheng Fu, Austin, TX (US); Mark D. Hall, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 11/213,470

(22) Filed: Aug. 26, 2005

(65) Prior Publication Data

US 2007/0048985 A1    Mar. 1, 2007

(51) Int. Cl.
*H01L 21/4763* (2006.01)
(52) U.S. Cl. .................. 438/592; 438/586; 438/303; 438/E21.444
(58) Field of Classification Search ........ 438/592–595, 438/303–306, 682, 586
See application file for complete search history.

(56) References Cited

U.S. PATENT DOCUMENTS

| | | | |
|---|---|---|---|
| 6,376,320 B1 * | 4/2002 | Yu | 438/303 |
| 6,391,767 B1 | 5/2002 | Huster et al. | |
| 6,524,939 B2 * | 2/2003 | Tseng | 438/592 |
| 6,528,402 B2 | 3/2003 | Tseng | |
| 6,727,539 B2 * | 4/2004 | Divakaruni et al. | 257/296 |

* cited by examiner

*Primary Examiner*—Dung A. Le

(57) ABSTRACT

A semiconductor fabrication process includes forming a gate stack overlying semiconductor substrate. Source/drain regions are formed in the substrate laterally aligned to the gate stack. A hard mask is formed overlying a gate electrode of the gate stack. A first silicide is then formed selectively over the source/drain regions. After removing the hard mask, a second silicide is selectively formed on the gate electrode. The first silicide and the second silicide are different. Forming the gate stack may include forming a gate dielectric on the semiconductor substrate and a polysilicon gate electrode on the gate dielectric. The gate electrode may have a line width of less than 40 nm. Forming the second silicide may include forming nickel silicide in upper portions of the gate electrode.

14 Claims, 3 Drawing Sheets

U.S. 7,235,473 B2

DUAL SILICIDE SEMICONDUCTOR FABRICATION PROCESS

FIELD OF THE INVENTION

The invention is in the field of semiconductor fabrication and, more particularly, semiconductor fabrication processes that use suicides.

RELATED ART

The use of suicides is well known in the field of semiconductor fabrication. A silicide is a silicon metal alloy. In MOS (metal oxide semiconductor) fabrication processes, silicides are used to provide low resistivity structures for contacting the gate electrode and the source and drain electrodes of a MOS transistor. Silicides preferably also serve as a barrier layer that prevents interaction between the semiconductor material of the source/drain areas and a subsequently formed interconnect.

Candidate metals for silicide formation that have received significant development effort include the Group VIII metal silicides, such as PtSi, $Pd_2Si$, $TiSi_2$, $CoSi_2$, and NiSi, which exhibit desirably low resistivity, react with silicon at desirably low temperatures, and do not react with silicon oxide. Unfortunately, none of these materials is ideal for all applications in advanced MOS fabrication. For example, the use of nickel as a silicide metal for source/drain regions is problematic because NiSi exhibits $NiSi_2$ related spiking on p+ active regions, and encroachment under the spacer and gate electrode. Cobalt, on the other hand, exhibits problems as a silicide over a polysilicon gate when the line width of the gate is less than approximately 40 nm. It would be desirable to implement a process that incorporates the benefits of multiple types of silicides without incurring disadvantages associated with any of the silicides.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor fabrication method and a resulting transistor use a first silicide on a first region of the transistor and a second silicide on a second region of the transistor. The figures illustrate an implementation for MOS (metal oxide semiconductor) fabrication processes in which the first silicide is used for source/drain regions and the second silicide is used for the gate electrode. In the described implementation, the first silicide is desirable as a source/drain silicide because it does not exhibit spiking or encroachment while the second silicide is desirable as a gate electrode silicide because it does not exhibit narrow line width effects on polysilicon.

Figure 1:
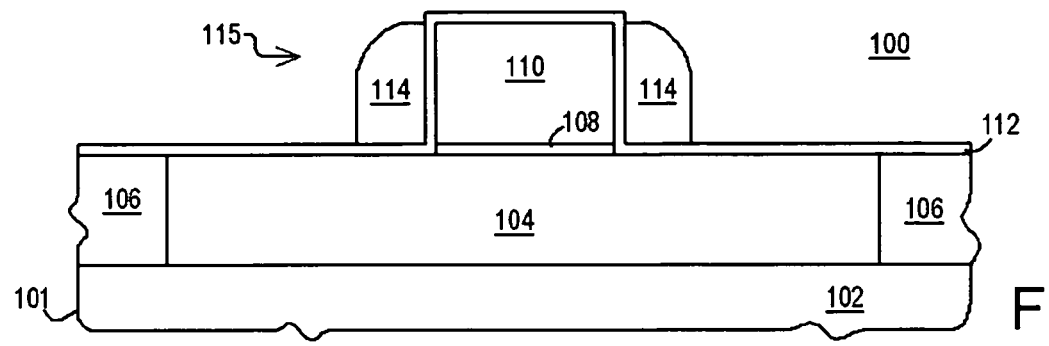
FIG. 1 is a partial cross sectional view of a semiconductor wafer at an intermediate stage in the fabrication of a semiconductor integrated circuit emphasizing the formation of a liner oxide and dielectric spacers in proximity to a conductive gate electrode.

Referring now to the drawings, FIG. 1 is a partial cross sectional view of a wafer 101 at an intermediate stage in the fabrication of an integrated circuit 100. In the depicted embodiment, a substrate of wafer 101 includes a semiconductor layer 104 that overlies a dielectric layer 102. Dielectric layer 102 may overlie another layer (not depicted) which may be another semiconductor layer or another material. In one embodiment, semiconductor layer 104 is crystalline silicon and dielectric layer 102 is a silicon oxide dielectric, in which case dielectric layer 102 may be referred to as buried oxide (BOX) layer 102. Each isolation structure 106 is a dielectric such as silicon oxide located in semiconductor layer 104. Isolation structures 106 provide electrical and physical isolation between adjacent transistors and other devices of integrated circuit 100. Although wafer 101 as depicted in FIG. 1 is a semiconductor on insulator (SOI) wafer 101, other implementations of the described processing sequence may be performed using conventional bulk semiconductor wafers.

As depicted in FIG. 1, a gate stack 115 has been formed over semiconductor layer 104. The depicted implementation of gate stack 115 includes a conductive gate electrode 110 overlying a gate dielectric 108. A dielectric layer 112, also referred to as liner oxide 112, covers semiconductor layer 104 and gate electrode 110. Extension spacers 114 are located adjacent to sidewalls of gate electrode 110. In the depicted implementation, liner oxide 112 is located intermediate between the sidewalls of gate electrode 110 and extension spacers 114.

Significantly, a line width of gate electrode 110 is less than approximately 40 nm in one embodiment. 40 nm is theorized to be a lower boundary for forming certain types of silicides on polysilicon. For polysilicon line widths of less than 40 nm, cobalt, for example, will not form a suitable silicide and, therefore, alternative silicides are required.

In an embodiment that uses conventional gate stack processing, gate electrode 110 is doped polycrystalline silicon (polysilicon), gate dielectric 108 is thermally formed silicon dioxide, liner oxide 112 is a CVD (chemical vapor deposition) silicon oxide such as a TEOS (tetraethylorthosilicate) oxide, and extension spacers 114 are silicon nitride. Semiconductor layer 104 may be p-doped for the case of NMOS transistors and n-doped for the case of PMOS transistors. Extension implants, halo implants, source drain implants, which are not shown for the sake of clarity, and other well known implants may have already been performed as depicted in FIG. 1.

Figure 2:
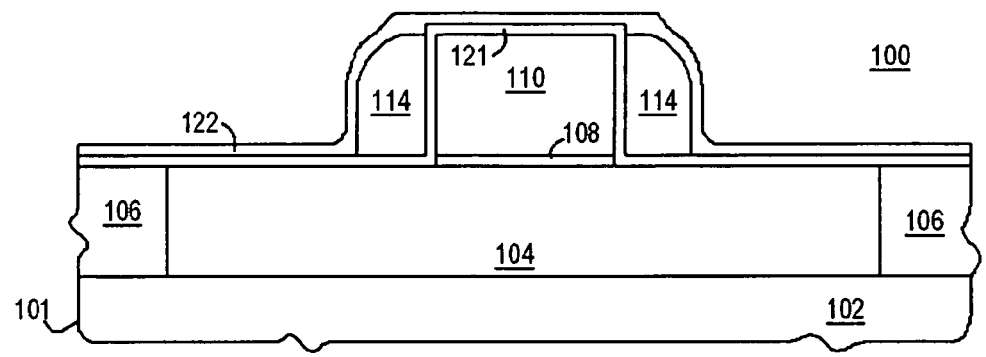
FIG. 2 depicts processing subsequent to FIG. 1 in which an antireflective coating is deposited on the wafer.

Referring to FIG. 2, an ARC (antireflective coating) 122 has been non-selectively or blanket deposited on wafer 101. ARC 122 is preferably an organic ARC (OARC) although inorganic and hybrid (organic/inorganic) ARCs may also be used. ARC 122 facilitates a subsequent photolithography step and, more particularly, improves the ability to define features in photoresist by reducing destructive interference caused by radiation reflecting back off of an underlying material.

Figure 3:
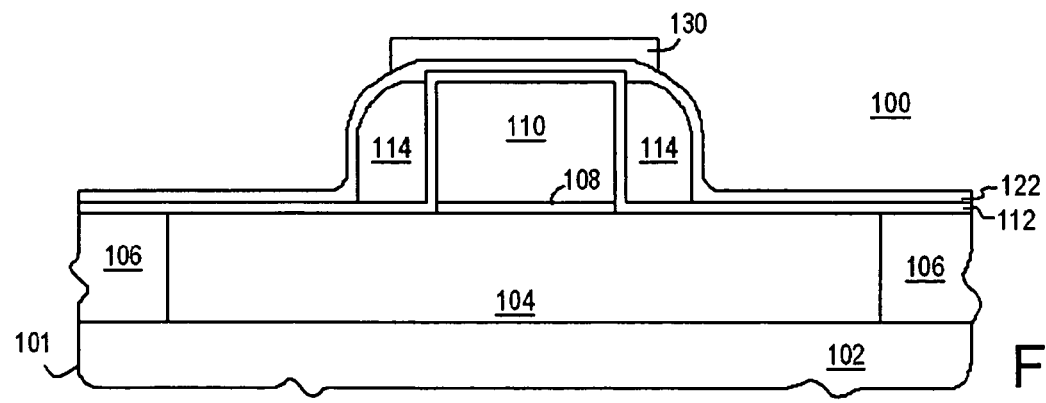
FIG. 3 depicts processing subsequent to FIG. 2 in which a photoresist mask is formed over the gate electrode.

Referring now to FIG. 3, a masking structure 130 is formed overlying ARC 122. Masking structure 130 is most suitably formed with a positive photoresist using the same mask used to pattern conductive gate electrode 110. Masking structure 130 is aligned to or covers gate electrode 110. It is desirable to "oversize" masking structure 130 with respect to gate electrode 110 to reduce the probability that a subsequent etch will expose a portion of gate electrode 108 when there is misalignment between masking structure 130 and gate electrode 110. In one embodiment, for example, extension spacers 114 have a width of approximately 60 to 70 nm and the process provides 30 to 35 nm of masking structure overlap per side such that the width of masking structure 130 is approximately 60 to 70 nm wider than the width of gate electrode 110. This processing is particularly achievable because the gate mask is typically fabricated 60-70 nm larger than the desired final line width. Therefore normal exposure or slight overexposure with a short trim of the photoresist will produce the desired final dimension of masking structure 130 without incurring the undesirable cost of an additional mask.

Figure 4:
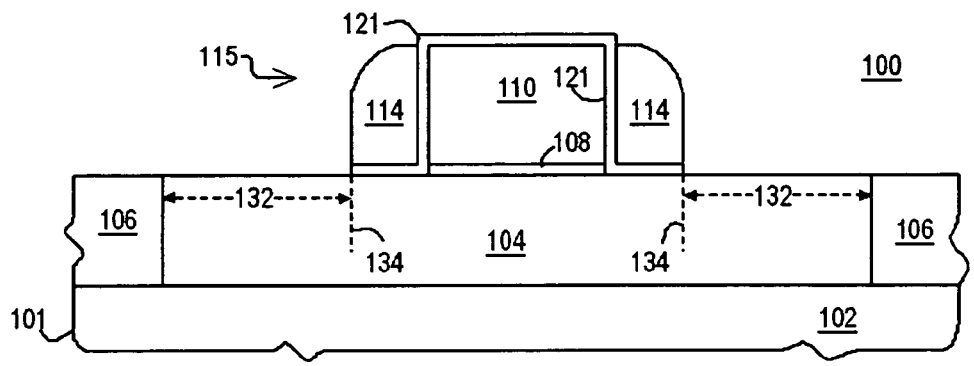
FIG. 4 depicts processing subsequent to FIG. 3 in which portions of the liner oxide are etched and the antireflective coating removed.

Referring now to FIG. 4, portions of the liner oxide 112 of FIG. 3 not covered by masking structure 130 or spacers 114 are etched away. The portions of the liner oxide remaining after this etch serve as a hard mask, designated by reference numeral 121, that protects an upper surface of gate electrode 110 during a subsequent silicide step. After forming hard mask 121, masking structure 130 and remaining portions of ARC layer 122 are stripped away. The formation of hard mask 121 exposes source/drain regions 132 of semiconductor layer 104. Lateral boundaries of source/drain regions 132 are defined by or aligned to boundaries 134 of gate stack 115 boundaries and by the isolation dielectric 106.

Importantly for purposes of the dual silicide processing described herein, hard mask 121 protects the semiconductor material such as the polysilicon in gate electrode 110 during a subsequent silicide processing sequence. The presence of hard mask 121 overlying gate electrode 110 enables the formation of a silicide selectively, with respect to the gate electrode, on the source/drain regions whereas conventional silicide processing produces a silicide simultaneously atop the polysilicon gate electrode and the source/drain regions.

Figure 5:
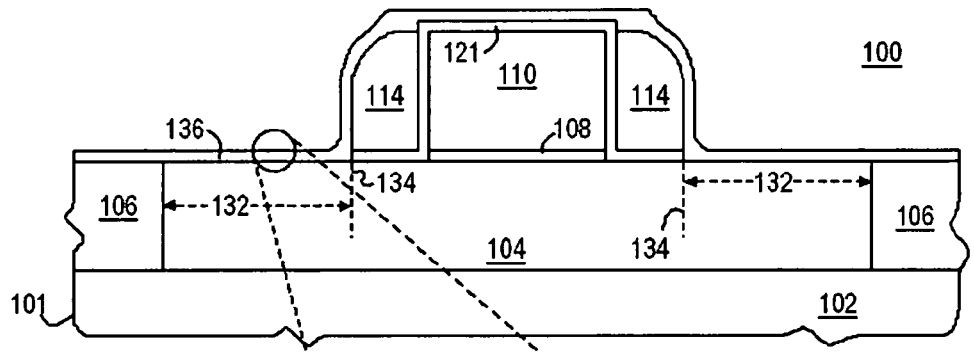
FIG. 5 depicts processing subsequent to FIG. 4 in which a first silicide metal layer is deposited.

Referring now to FIG. 5, a first metal layer 136 is non-selectively deposited on wafer 101. First metal layer 136 contains the metal for the silicide to be formed in source/drain regions 132. The candidate metals for this first metal silicide include any of the group VIII metals. In an implementation desirable for its low resistivity, however, first metal layer 136 employs cobalt as the first silicide metal.

Figure 6:
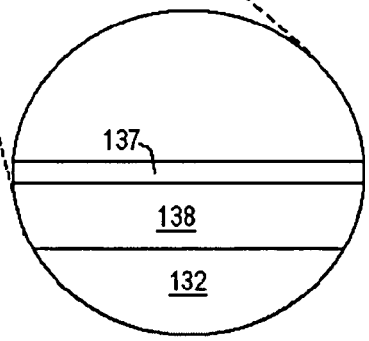
FIG. 6 depicts details of the silicide metal layer of FIG. 5.

In the preferred embodiment, first metal layer 136 actually includes two or more sublayers depicted in the detail view of FIG. 6. In one implementation, the first sublayer or metal sublayer 138 contains the metal that forms the silicide. In the embodiment referred to above, metal sublayer 138 is a cobalt layer. The second sublayer or capping sublayer 137 is a thin, e.g., approximately 10-15 nm, barrier layer suitable for preventing the introduction of oxygen atoms from the ambient during subsequent annealing step during silicide formation. Capping layer 137 also enables formation of a smoother silicide layer. A suitable barrier compound is titanium nitride, which is well known in the field of semiconductor processing for its barrier qualities.

Figure 7:
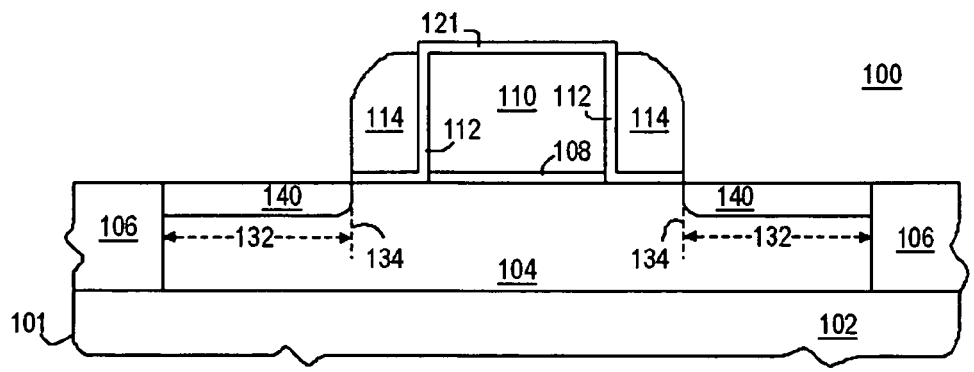
FIG. 7 depicts processing subsequent to FIG. 5 in which a first silicide is formed on the source/drain regions.

Referring now to FIG. 7, silicide processing is performed to create first silicide structures 140 within source/drain regions 132. In one embodiment, the silicide processing includes performing a first rapid thermal anneal (RTA) process by subjecting wafer 101 to an inert ambient heated to a temperature of less than 600° C. for a duration of less than 30 seconds to react the cobalt or other metal in sublayer 138 with the underlying silicon or other semiconductor material in source/drain regions 132. After the first RTA is performed, capping sublayer 137 and unreacted portions of the cobalt or other metal in metal sublayer 138 are selectively removed with an appropriate metal etch. In the embodiment depicted in FIG. 7, the unreacted portions of metal layer 138 include all portions overlying isolation dielectric 106, all portions on adjacent spacers 114, and all portions overlying hard mask 121 thereby leaving the exposed source/drain regions 132 as the only areas in which the metal will react. After removing unreacted cobalt, the preferred embodiment includes a second RTA step in which wafer 101 is heated in an inert ambient to a temperature of greater than 600° C.

Figure 8:
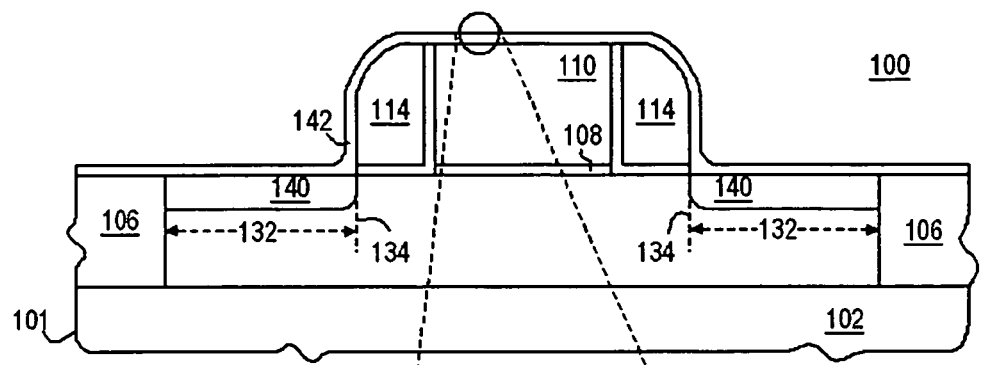
FIG. 8 depicts processing subsequent to FIG. 7 in which portions of the liner oxide are removed and a second silicide metal layer is deposited.

Referring now to FIG. 8, exposed portions of hard mask 121, which are the portions of hard mask layer 121 overlying an upper surface of gate electrode 110, are removed using a conventional HF dip or other appropriate procedure, and a second metal layer 142 is blanket deposited over wafer 101. In the preferred embodiment, the metal in second metal layer 142 is different than the metal in first metal layer 136 so that a silicide formed from second metal layer 142 is different than the silicide of first silicide structures 140. In one embodiment designed to avoid problems associated with using cobalt to form a silicide on fine polysilicon lines, second metal layer 142 includes a second metal material such as nickel. Although nickel and its silicide are associated with spiked junctions and encroachment when used on source/drain regions, nickel exhibits desirable characteristics such as low resistivity when used on polysilicon gate electrodes. Moreover, nickel does not exhibit the same difficulties that cobalt exhibits when used to form silicides over narrow polysilicon lines.

Figure 9:
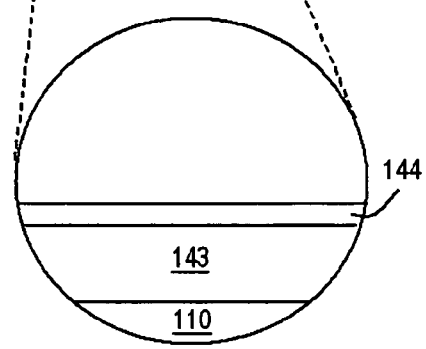
FIG. 9 depicts details of the silicide metal layer of FIG. 8.

In one embodiment, second metal layer 142 includes two or possibly more sublayers 143 and 144 depicted in the detail view of FIG. 9. First sublayer 143 contains the nickel or another metal that is used to form the gate electrode silicide, which includes a metal such as nickel layer according to one embodiment. Second sublayer 144 is a barrier layer that includes a barrier material such as the titanium nitride described above with respect to capping sublayer 137 of FIG. 6.

Figure 10:
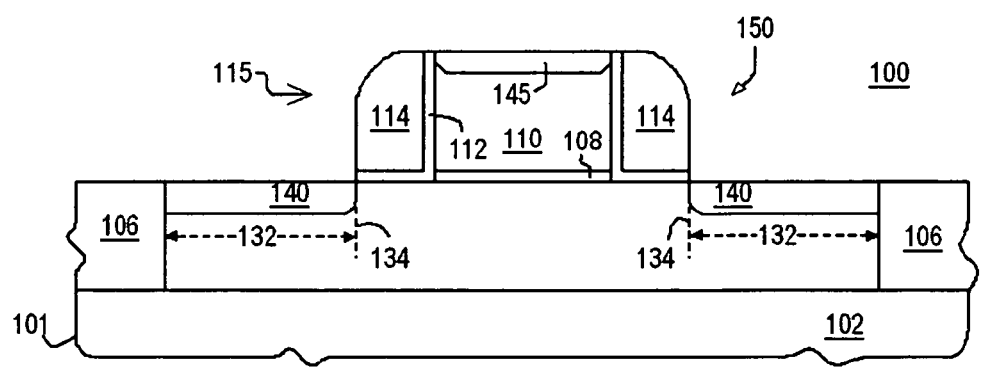
FIG. 10 depicts processing subsequent to FIG. 8 in which a second silicide is formed over the gate electrode.

Referring now to FIG. 10, a second silicide processing sequence is performed to form second silicide 145 overlying gate electrode 115, but not over the remaining areas of the integrated circuit 100 and most significantly, not over source/drain regions 132 of wafer 101. Thus, the depicted processing sequence is able to form a first type of silicide, e.g., $CoSi_2$, in source/drain regions 132 and a second type of silicide, e.g., nickel silicide, overlying the gate electrode. In one embodiment, this second processing sequence includes a first RTA process in which wafer 101 is heated in an inert ambient to not more than 500° C. for less than 30 seconds.

Thereafter, the capping layer 144 and unreacted portions of metal layer 143 are removed with a selective etch. Importantly, the unreacted nickel includes the portions of the second metal layer 143 overlying first silicide 140. After removal of the unreacted nickel, a second RTA is performed by heating wafer 101 in an inert ambient to a temperature not more than 500° C. for a duration not exceeding 30 seconds.

The described processing sequence is suitable for creating an integrated circuit 100 that includes a semiconductor transistor 150. Transistor 150 is a PMOS or NMOS transistor depending upon the application and implementation. Integrated circuit 100 may include some transistors 150 that are PMOS and others that are NMOS. Transistor 150 includes a gate stack 115 overlying a semiconductor substrate. The semiconductor substrate overlies a buried dielectric and, in the depicted embodiment, is positioned between a pair of isolation dielectric regions 106.

Gate stack 115 includes a gate electrode 110, liner oxide 112 formed on surface of wafer 101, and extension spacers 114 formed adjacent to liner oxide 112. An upper surface of gate electrode 110 includes a second type of metal silicide. In one embodiment, second silicide is nickel silicide (NiSi).

Transistor 150 further includes source/drain regions 132 in semiconductor layer 104. Source/drain regions 132 are laterally positioned on either side of a lateral boundary 134 defined by the edges of gate stack 115. A first type of silicide 140 has been formed in the source/drain regions 132 of wafer 101. In one embodiment, first silicide 140 is a cobalt silicide ($CoSi_2$).

Those skilled in the field of semiconductor fabrication processing will recognize that integrated circuit 100 as depicted in FIG. 10 requires additional processing (not depicted) to complete a fully functional integrated circuit. Most notably, the described processing sequence requires multiple interconnect layers to interconnect the multitude of transistors, with transistor 150 being one of such multitude, in an integrated circuit. The details of this "back end" processing are omitted from this disclosure as not being particularly germane to the concept of using multiple types of silicides within a single transistor.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment illustrates single gate, planar transistors, other embodiments may encompass various types of "floating gate" technologies. As another example, although the depicted embodiment illustrates the liner oxide as a hard mask, other embodiments use a different hard mask material such as TiN or a deposited oxide that may serve as a hard mask for protecting the gate stack from silicidation during the first silicidation described herein. As another example, although the described silicide formation processing includes the use of multiple RTA steps, other embodiments may use a single RTA step. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming a gate stack overlying semiconductor substrate, wherein the gate stack includes a conductive gate electrode;
   forming source/drain regions in the semiconductor substrate laterally aligned to the gate stack;
   forming a hard mask overlying the gate electrode of the gate stack, wherein forming the hard mask comprises:
      depositing an antireflective coating (ARC) on the wafer,
      patterning a masking structure overlying the ARC, wherein the masking structure is aligned to the gate electrode,
      etching the ARC and the liner oxide to expose the source/drain regions, and
      stripping the masking structure and remaining portions of the ARC, wherein the hard mask comprises the portion of the liner oxide overlying the upper surface of the gate electrode;
   selectively forming a first silicide in the source/drain regions;
   removing the hard mask; and
   selectively forming a second silicide in upper portions of the gate electrode, wherein the first silicide and the second silicide are different.

2. The method of claim 1, wherein forming the gate stack comprises:
   forming a gate dielectric on the semiconductor substrate and a polysilicon gate electrode on the gate dielectric;
   forming a liner oxide on an upper surface of the wafer and on sidewalls and an upper surface of the gate electrode; and
   forming dielectric extension spacers on the liner oxide and adjacent to sidewalls of the gate electrode, wherein said forming of the dielectric spacers leaves the liner oxide overlying the upper surface of the gate electrode.

3. The method of claim 2, wherein forming the gate electrode comprises forming a gate electrode having a line width of less than 40 nm.

4. The method of claim 2, wherein forming the second silicide comprises forming nickel silicide in upper portions of the gate electrode.

5. The method of claim 1, wherein the hard mask layer comprises silicon oxide and the ARC comprises an organic ARC.

6. The method of claim 1, wherein the first silicide is cobalt silicide and the second silicide is nickel silicide.

7. The method of claim 6, wherein forming the first silicide includes:
   non selectively depositing a first layer including a first metal;
   performing a first rapid thermal anneal to react the first metal with the source/drain regions;
   removing unreacted portions of the first metal layer; and
   performing a second rapid thermal anneal.

8. A semiconductor fabrication process, comprising:
   forming a hard mask selectively overlying an upper surface of a gate electrode including exposing source/drain regions of an underlying substrate displaced on either side of the gate electrode;

forming a first silicide selectively on the exposed source/drain regions of the substrate, wherein forming the first silicide comprises depositing a first metal sublayer and depositing a barrier sublayer over the first metal sublayer, and wherein the first metal sublayer includes cobalt and wherein the barrier layer comprises titanium nitride;

removing the hard mask to expose the upper surface of the gate electrode; and forming a second silicide selectively on the upper surface of the gate electrode, wherein the first silicide contains a first metal and the second silicide contains a second metal.

9. The method of claim 8, wherein forming the second silicide comprises depositing a second metal sublayer and a second barrier layer after forming the first silicide.

10. The method of claim 9, wherein the second metal sublayer includes nickel and wherein the second barrier layer includes titanium nitride.

11. The method of claim 8, wherein forming the hard mask includes forming a liner oxide including silicon oxide on the gate electrode, forming spacers including silicon nitride adjacent sidewalls of the liner oxide and the gate electrode wherein forming the spacers leaves the liner oxide intact overlying the gate electrode.

12. The method of claim 11, wherein forming the hard mask includes depositing an organic antireflective coating (ARC) layer over the hard mask and patterning the antireflective coating to remove portions of the ARC overlying the source/drain regions.

13. The method of claim 12, wherein patterning the ARC layer comprises patterning a photoresist layer with a gate electrode mask.

14. The method of claim 13, wherein patterning the ARC layer comprises patterning the ARC layer with the gate electrode layer to produce ARC structures that are wider than the corresponding gate electrode.

* * * * *